United States Patent
Fukui et al.

(10) Patent No.: US 9,208,956 B2
(45) Date of Patent: Dec. 8, 2015

(54) PHOTOELECTRIC CONVERSION ELEMENT AND PHOTOELECTRIC CONVERSION MODULE

(75) Inventors: Atsushi Fukui, Osaka (JP); Ryoichi Komiya, Osaka (JP); Ryosuke Yamanaka, Osaka (JP)

(73) Assignee: Sharp Kabushiki Kaisha, Oskaa-shi, Osaka (JP)

( * ) Notice: Subject to any disclaimer, the term of this patent is extended or adjusted under 35 U.S.C. 154(b) by 43 days.

(21) Appl. No.: 14/111,392

(22) PCT Filed: Apr. 6, 2012

(86) PCT No.: PCT/JP2012/059509
§ 371 (c)(1),
(2), (4) Date: Oct. 11, 2013

(87) PCT Pub. No.: WO2012/141095
PCT Pub. Date: Oct. 18, 2012

(65) Prior Publication Data
US 2014/0026938 A1  Jan. 30, 2014

(30) Foreign Application Priority Data
Apr. 14, 2011 (JP) ................. 2011-090261

(51) Int. Cl.
*H01G 9/20* (2006.01)
*H01L 51/00* (2006.01)

(52) U.S. Cl.
CPC ........... *H01G 9/2022* (2013.01); *H01G 9/2081* (2013.01); *H01G 9/2031* (2013.01); *H01G 9/2059* (2013.01); *H01L 51/0086* (2013.01); *Y02E 10/542* (2013.01)

(58) Field of Classification Search
CPC . H01G 9/2022; H01G 9/2081; H01G 9/2031; H01G 9/2059

USPC .......................... 136/244, 256, 252
See application file for complete search history.

(56) References Cited

U.S. PATENT DOCUMENTS 4,927,721 A   5/1990  Gratzel et al.
5,350,644 A * 9/1994  Graetzel et al. ............... 429/111
(Continued)

FOREIGN PATENT DOCUMENTS

JP         1-220380      9/1989
JP       2000-285977    10/2000
(Continued)

OTHER PUBLICATIONS

JP 2002-314108 A Online machine translaiton, translated on Jan. 12, 2015.*
(Continued)

*Primary Examiner* — Golam Mowla
(74) *Attorney, Agent, or Firm* — Nixon & Vanderhye, P.C.

(57) ABSTRACT

A light transmitting substrate having at least a light receiving surface, a first electrode located on the light transmitting substrate, a collector electrode located on at least a part of the first electrode and formed from a metal thin film, a photoelectric conversion portion located on an upper surface of the first electrode or the collector electrode, carrying a photosensitizer, and immersed in a carrier transport material, an insulating frame portion surrounding sides of the photoelectric conversion portion, and a second electrode located to be opposed to the first electrode above the photoelectric conversion portion are provided. Relation of $Isc \times Rh < 0.05 \times Voc$ is satisfied, where Isc represents a short-circuit current value of a dye-sensitized solar cell, Rh represents a total value of electrical resistance values of the collector electrode, the first electrode, and the second electrode, and Voc represents an open circuit voltage value of the dye-sensitized solar cell.

10 Claims, 6 Drawing Sheets (56) References Cited

U.S. PATENT DOCUMENTS

| | | | |
|---|---|---|---|
| 5,441,827 A * | 8/1995 | Gratzel et al. | 429/111 |
| 5,525,440 A * | 6/1996 | Kay et al. | 429/111 |
| 6,538,194 B1 * | 3/2003 | Koyanagi et al. | 136/256 |
| 6,555,741 B1 * | 4/2003 | Hopkins et al. | 136/263 |
| 6,706,963 B2 * | 3/2004 | Gaudiana et al. | 136/263 |
| 6,756,537 B2 * | 6/2004 | Kang et al. | 136/263 |
| 7,569,765 B2 * | 8/2009 | Matsui et al. | 136/263 |
| 2010/0116311 A1 | 5/2010 | Fukui | |
| 2011/0197967 A1 * | 8/2011 | Kaijo et al. | 136/256 |

FOREIGN PATENT DOCUMENTS

| | | |
|---|---|---|
| JP | 2002-314108 | 10/2002 |
| JP | 2003-203681 | 7/2003 |
| WO | WO 2008/114825 | 9/2008 |

OTHER PUBLICATIONS

International Search Report for PCT/JP2012/059509 mailed Jul. 3, 2012.

\* cited by examiner

PHOTOELECTRIC CONVERSION ELEMENT AND PHOTOELECTRIC CONVERSION MODULE

This application is the U.S. national phase of International Application No. PCT/JP2012/059509 filed 6 Apr. 2012 which designated the U.S. and claims priority to JP 2011-090261 filed 14 Apr. 2011, the entire contents of each of which are hereby incorporated by reference.

TECHNICAL FIELD

The present invention relates to a photoelectric conversion element and a photoelectric conversion module.

BACKGROUND ART

A solar cell converting sunlight to electric power has attracted attention as a source of energy replacing fossil fuel. A solar cell including a crystalline silicon substrate and a thin-film silicon solar cell have currently been put into practical use. The former, however, is disadvantageous in high cost for fabricating a silicon substrate, and the latter is disadvantageous in high manufacturing cost because of necessity for use of various semiconductor manufacturing gases or a complicated apparatus.

Therefore, though efforts for reducing cost per generated power output have been continued by enhancing efficiency in photoelectric conversion in any solar cells, the problems above have not yet been solved.

Japanese Patent Laying-Open No. 1-220380 (PTD 1) is a prior document disclosing a dye-sensitized solar cell achieved by applying photo-induced electron transfer of metal complex as a solar cell of a new type. The dye-sensitized solar cell described in PTD 1 has such a structure that a photoelectric conversion layer having an absorption spectrum in a visible light region by adsorbing a photosensitizing dye and an electrolytic solution are sandwiched between a glass substrate having a first electrode formed on a surface thereof and a glass substrate having a second electrode formed on a surface thereof.

In the dye-sensitized solar cell, as a transparent first electrode side is irradiated with light, electrons are generated in the photoelectric conversion layer. Generated electrons are transferred from the first electrode through an external electric circuit to the opposed second electrode. Transferred electrons are carried by ions in an electrolyte, and they return to the photoelectric conversion layer. Electric energy can be taken out through repetition of such a series of electron transfer.

The dye-sensitized solar cell described in PTD 1, however, has such a basic structure that an electrolytic solution is introduced in between two glass substrates. Therefore, though it is possible to prototype a solar cell having a small area, it is difficult to apply this structure to a solar cell having an area as large as 1-m square. This is because, as an area of a single solar cell is increased, a short-circuit current increases in proportion to the area, however, resistance in an in-plane direction of the first electrode increases, which leads to increase in internal series electrical resistance of the solar cell and consequently, lowering in fill factor (FF) in current-voltage characteristics at the time of photoelectric conversion and resultant failure in obtaining sufficient efficiency in photoelectric conversion.

In order to solve the problems above, Japanese Patent Laying-Open No. 2003-203681 (PTD 2) as a prior art document discloses a photoelectric conversion element achieving lowering in electrical resistance by forming a collector electrode on a first electrode. In the photoelectric conversion element described in PTD 2, a lattice-shaped collector electrode made of an alloy of gold and silver is formed on the first electrode between a plurality of strip-shaped photoelectric conversion portions formed on the same plane. This collector electrode can improve FF and short-circuit current density.

CITATION LIST

Patent Document

PTD 1: Japanese Patent Laying-Open No. 1-220380
PTD 2: Japanese Patent Laying-Open No. 2003-203681

SUMMARY OF INVENTION

Technical Problem

Though FF can be improved by forming a collector electrode, an excessive amount of formation of collector electrodes leads to decrease in quantity of light which can be received and resultant lowering in power generation efficiency of a photoelectric conversion element. Therefore, in the photoelectric conversion element described in PTD 2, an aperture ratio of grids is set to 90 to 99%. When a size of one photoelectric conversion element is greater than 50-mm square, however, a short-circuit current (Isc) increases in proportion to an area. Therefore, with an amount of formation of collector electrodes of which aperture ratio is as high as 90% or higher, high FF cannot be achieved.

In the case that an amount of formation of collector electrodes is thus suppressed, when a photoelectric conversion element is increased in size and an area for light reception is increased, internal resistance of the photoelectric conversion element cannot sometimes sufficiently be lowered in spite of provision of a collector electrode.

The present invention was made in view of the problems above, and an object thereof is to provide a photoelectric conversion element and a photoelectric conversion module capable of realizing high FF while maintaining a high short-circuit current (Isc) and achieving high conversion efficiency.

Solution to Problem

A photoelectric conversion element based on the present invention includes a substrate having at least a light receiving surface, a first electrode formed from a transparent conductive film located on the substrate, a collector electrode located on at least a part of the first electrode and formed from a metal thin film, a photoelectric conversion portion located on an upper surface of the first electrode or the collector electrode, carrying a photosensitizer, and immersed in a carrier transport material, an insulating frame portion surrounding sides of the photoelectric conversion portion, and a second electrode located to be opposed to the first electrode above the photoelectric conversion portion. In the photoelectric conversion element, relation of $Isc \times Rh < 0.05 \times Voc$ is satisfied, where Isc (A) represents a short-circuit current value of the photoelectric conversion element, Rh ($\Omega$) represents a total value of electrical resistance values of the collector electrode, the first electrode, and the second electrode, and Voc (V) represents an open circuit voltage value of the photoelectric conversion element.

A photoelectric conversion module based on the present invention has a plurality of photoelectric conversion elements described above. The plurality of photoelectric conversion elements are electrically connected in series. In the photoelectric conversion elements electrically connected to each other, the first electrode or the collector electrode of one photoelectric conversion element is connected to the second electrode of the other photoelectric conversion element.

Preferably, the collector electrode extends in a direction in which the photoelectric conversion elements connected in series are aligned.

Preferably, the photoelectric conversion portion has a rectangular shape having a longitudinal direction in a plan view. The photoelectric conversion elements connected in series are located such that the longitudinal directions of the photoelectric conversion portions are substantially in parallel to each other.

In one form of the present invention, the photoelectric conversion portion has a length in the longitudinal direction not smaller than 10 mm.

In one form of the present invention, the photoelectric conversion portion has a width in a direction orthogonal to the longitudinal direction, not smaller than 5 mm and not greater than 10 mm.

Preferably, the collector electrode has parallel portions extending substantially in parallel at an interval not smaller than 5 mm and not greater than 10 mm in a direction orthogonal to a direction of extension. Preferably, the parallel portion has a width not smaller than 0.1 mm and not greater than 0.6 mm.

Preferably, the collector electrode is formed of a material having corrosion resistance to the carrier transport material.

Preferably, the collector electrode is formed of any of titanium, nickel, and tantalum.

Advantageous Effects of Invention

According to the present invention, a photoelectric conversion element can realize high FF while maintaining a high short-circuit current (Isc) and achieve high conversion efficiency.

DESCRIPTION OF EMBODIMENTS

A photoelectric conversion element according to a first embodiment of the present invention will be described hereinafter with reference to the drawings. In the description of the embodiment below, the same or corresponding elements in the drawings have the same reference characters allotted and description thereof will not be repeated.

(First Embodiment)
<Photoelectric Conversion Element>

Figure 1:
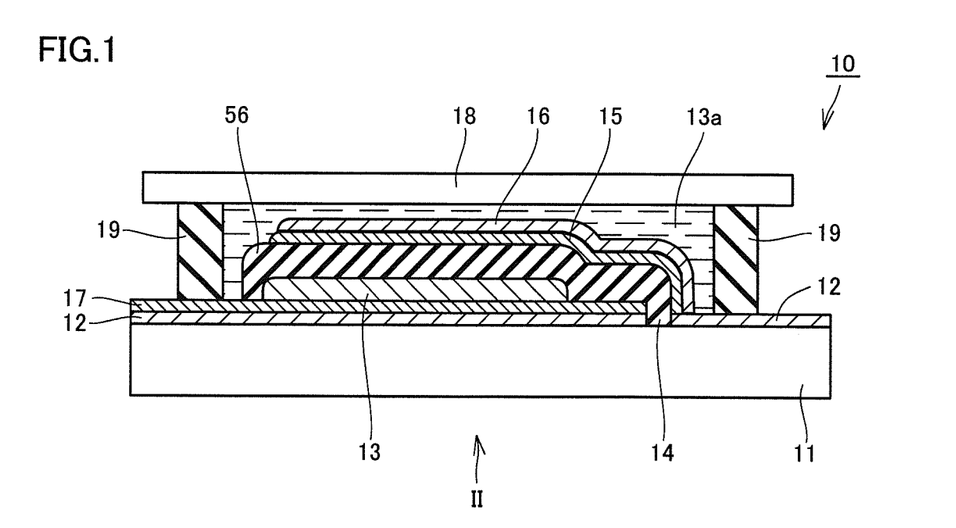
FIG. 1 is a cross-sectional view showing a structure of a dye-sensitized solar cell representing a photoelectric conversion element according to a first embodiment of the present invention.
Figure 2:
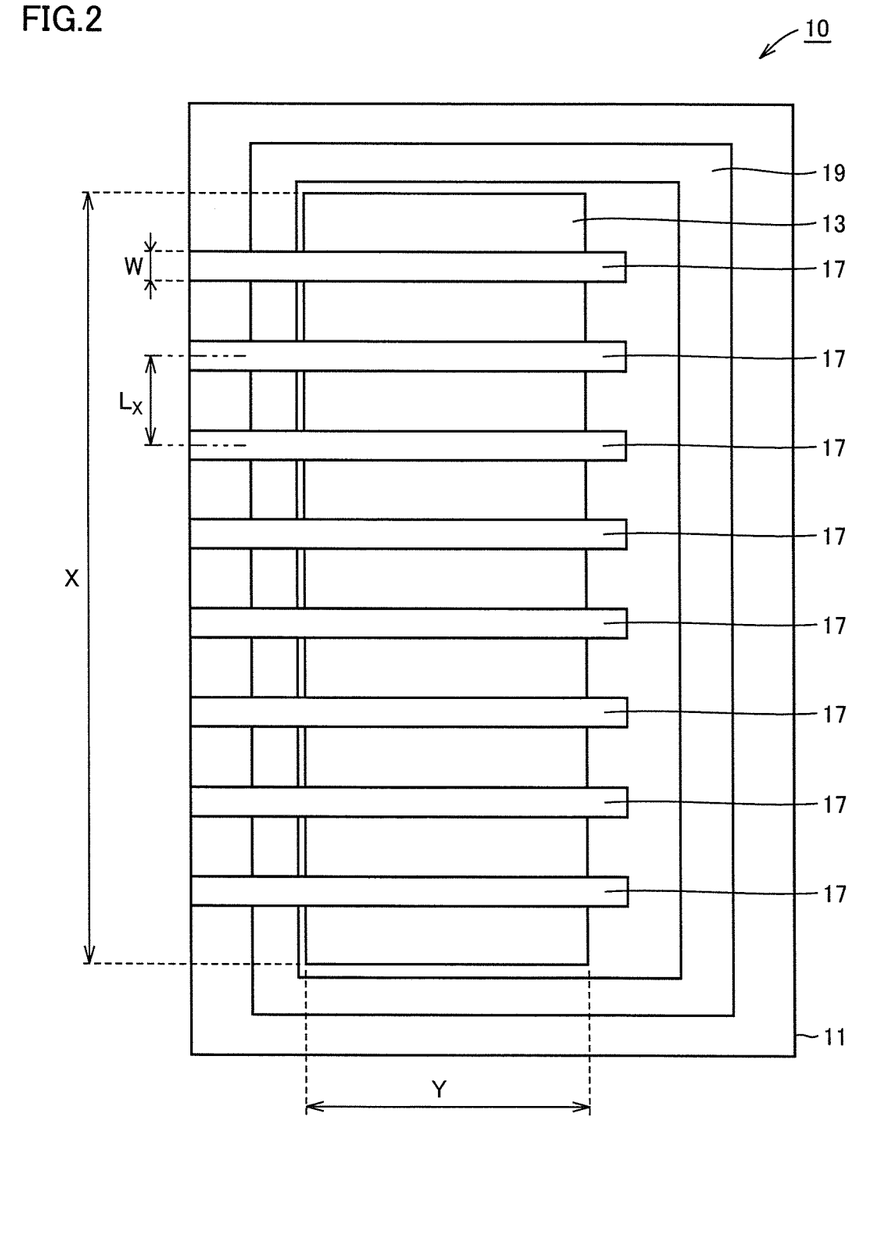
FIG. 2 is a diagram of the dye-sensitized solar cell in FIG. 1 viewed in a direction shown with an arrow II.

FIG. 1 is a cross-sectional view showing a structure of a dye-sensitized solar cell representing a photoelectric conversion element according to the first embodiment of the present invention. FIG. 2 is a diagram of the dye-sensitized solar cell in FIG. 1 viewed in a direction shown with an arrow 11. It is noted that some features of the dye-sensitized solar cell are not illustrated in FIG. 2.

As shown in FIGS. 1 and 2, a dye-sensitized solar cell 10 according to the first embodiment of the present invention includes a light transmitting substrate 11 having a light receiving surface, a first electrode 12 formed from a transparent conductive film located on light transmitting substrate 11, and a collector electrode 17 located on at least a part of first electrode 12 and formed from a metal thin film.

In addition, dye-sensitized solar cell 10 includes a photoelectric conversion portion 13 located on an upper surface of first electrode 12 or collector electrode 17, carrying a photosensitizer, and immersed in a carrier transport material 13a and an insulating frame portion 19 surrounding sides of photoelectric conversion portion 13.

Moreover, dye-sensitized solar cell 10 includes a second electrode 16 located to be opposed to first electrode 12 above photoelectric conversion portion 13 and a cover 18. Cover 18 is fixed to insulating frame portion 19. A small space is formed between cover 18 and second electrode 16, and the space is filled with carrier transport material 13a. It is noted that this space does not necessarily have to be formed.

Furthermore, dye-sensitized solar cell 10 includes a porous insulating layer 14 formed on photoelectric conversion portion 13 and a catalyst layer 15 formed on porous insulating layer 14, in the inside surrounded by insulating frame portion 19. Second electrode 16 is formed on catalyst layer 15.

In the present embodiment, photoelectric conversion portion 13 has a rectangular shape having a longitudinal direction in a plan view. Specifically, photoelectric conversion portion 13 is formed with a length X and a width Y. It is noted that a shape of photoelectric conversion portion 13 is not limited thereto and it may be circular or polygonal.

Collector electrode 17 extends in a direction orthogonal to the longitudinal direction of photoelectric conversion portion 13. A plurality of collector electrodes 17 each having a width W are formed. Collector electrodes 17 adjacent to each other are formed at an interval $L_x$.

Each component will be described in detail below.
<Light Transmitting Substrate 11>

In light transmitting substrate 11, at least a portion serving as a light receiving surface has a light transmissive property. Therefore, light transmitting substrate 11 is formed of a material allowing passage of light. It is noted that light transmitting substrate 11 should only be formed of a material substantially allowing passage of light of a wavelength which is at least effectively sensitive to a dye which will be described later and it does not necessarily have to have a property to transmit light in all wavelength regions. Light transmitting substrate 11 preferably has a thickness not smaller than 0.2 mm and not greater than 5 mm.

A material forming light transmitting substrate 11 is not particularly limited so long as the material can generally be used for a solar cell and can exhibit an effect of the present invention. Examples of such a material include a glass substrate of soda glass, fused silica glass, crystal silica glass, and the like, a heat resistant resin plate such as a flexible film, and the like.

Examples of a material forming the flexible film include tetraacetyl cellulose (TAC), polyethylene terephthalate (PET), polyphenylene sulfide (PPS), polycarbonate (PC), polyarylate (PA), polyetherimide (PEI), phenoxy resin, Teflon™, and the like.

In forming other members on light transmitting substrate 11, light transmitting substrate 11 may be heated. For example, when light transmitting substrate 11 is heated approximately to 250° C. in forming photoelectric conversion portion 13 composed of a porous semiconductor on light transmitting substrate 11, Teflon having resistance to heat not lower than 250° C. or the like is employed as the material for light transmitting substrate 11.

Light transmitting substrate 11 can be made use of as a base at the time when dye-sensitized solar cell 10 is attached to another structure. At that time, a peripheral portion of light transmitting substrate 11 is coupled to another structure by using such a fastening member as a screw with a metalworked part being interposed.

<First Electrode 12>

A material for forming first electrode 12 is not particularly limited so long as it has conductivity and a light transmissive property. Examples of a material forming first electrode 12 include indium-tin composite oxide (ITO), tin oxide ($SnO_2$), fluorine-doped tin oxide (FTO), zinc oxide (ZnO), and the like. First electrode 12 composed of such a material can be formed on light transmitting substrate 11 with such a known method as sputtering and spraying.

First electrode 12 has a layer thickness preferably not smaller than 0.02 μm and not greater than 5 μm. Electrical resistance of first electrode 12 is preferably as low as possible and it is preferably not higher than 40 Ω/sq.

<Collector Electrode 17>

A material for forming collector electrode 17 is not particularly limited so long as the material can generally be used for a solar cell and can exhibit an effect of the present invention. Examples of such a material include gold, silver, copper, aluminum, nickel, titanium, tantalum, and the like.

Among these, nickel, titanium, and tantalum having high corrosion resistance to carrier transport material 13a (an electrolytic solution), gold, silver, copper, and aluminum having high electrical conductivity, or the like are preferred as a material for forming collector electrode 17. In the case that collector electrode 17 is composed of a material not having corrosion resistance to an electrolytic solution, a protection insulating layer composed of silicon oxide, zirconium oxide, rutile-type titanium oxide, or the like is preferably formed on collector electrode 17.

Collector electrode 17 is formed on first electrode 12 with such a known method as sputtering, spraying, or screen printing.

<Insulating Frame Portion 19>

Insulating frame portion 19 is composed of a material having an electrically insulating property and capable of sealing carrier transport material 13a. For example, as a material for insulating frame portion 19, an ultraviolet curable resin, a thermosetting resin, or the like can be employed. In addition, a material which can readily be formed to a desired shape on first electrode 12 and collector electrode 17 is preferably employed as a material for insulating frame portion 19. Specifically, as a material for insulating frame portion 19, a silicone resin, an epoxy resin, a polyisobutylene-based resin, a hot melt resin, a glass-based material, and the like are preferred, and two or more of these may be employed to form insulating frame portion 19 in a stack structure.

In forming photoelectric conversion portion 13 after insulating frame portion 19 is formed, insulating frame portion 19 is composed of a material having heat resistance to a temperature for forming photoelectric conversion portion 13. In addition, since insulating frame portion 19 is exposed to ultraviolet rays included in sunlight, insulating frame portion 19 is composed of a material which is less likely to deteriorate due to ultraviolet rays. Therefore, insulating frame portion 19 is preferably formed of a glass-based material.

Examples of a glass-based material include materials commercially available as a glass paste or glass frit. In consideration of reactivity with carrier transport material 13a and load imposed on an environment, a lead-free glass-based material is preferably employed. In a case where insulating frame portion 19 is formed above light transmitting substrate 11 made from a glass substrate, insulating frame portion 19 is preferably formed at a firing temperature not higher than 550° C. For example, a bismuth-based glass paste is preferably employed as a glass-based material.

<Photoelectric Conversion Portion 13>

Photoelectric conversion portion 13 is formed from a porous semiconductor layer to which a dye has been adsorbed and carrier transport material 13a can transfer therethrough.

(Porous Semiconductor Layer)

A type of a semiconductor forming a porous semiconductor layer is not particularly limited so long as it is generally used as a material for photoelectric conversion. For example, as a material for a porous semiconductor layer, a semiconductor compound such as titanium oxide, zinc oxide, tin oxide, iron oxide, niobium oxide, cerium oxide, tungsten oxide, barium titanate, strontium titanate, cadmium sulfide, lead sulfide, zinc sulfide, indium phosphide, copper-indium sulfide ($CuInS_2$), $CuAlO_2$, and $SrCu_2O_2$, and combination thereof can be employed. Among these, titanium oxide is preferably employed as a material for a porous semiconductor layer from a point of view of stability.

Titanium oxide suitably employed for a porous semiconductor layer encompasses various types of titanium oxide in a narrow sense such as anatase-type titanium oxide, rutile-type titanium oxide, amorphous titanium oxide, metatitanic acid, and orthotitanic acid, titanium hydroxide, hydrous titanium oxide, and the like, and they can be used alone or as a mixture. Two types of crystalline titanium oxide of anatase type and rutile type can be in any form depending on a manufacturing method thereof or thermal hysteresis, however, the crystalline titanium oxide is generally of an anatase type. From a point of view of dye sensitizing, a material high in content of anatase-type, such as titanium oxide containing 80% or more of anatase-type, is preferred as titanium oxide.

A form of a semiconductor may be any of monocrystalline and polycrystalline. From a point of view of stability, ease in crystal growth, manufacturing cost, and the like, however, a polycrystalline form is preferred. Semiconductor fine particles of nanoscale or microscale composed of polycrystal are preferably employed for a porous semiconductor. Therefore, fine particles of titanium oxide are preferably employed as a material for a porous semiconductor layer.

Fine particles of titanium oxide are manufactured with such a known method as a vapor phase method or a liquid phase method such as a hydrothermal synthesis method and a sulfuric acid process. In addition, fine particles of titanium oxide may be manufactured by subjecting a chloride developed by Degussa to hydrolysis at a high temperature.

A mixture of fine particles of two or more particle sizes composed of the same or different semiconductor compound(s) may be employed as semiconductor fine particles. It is considered that semiconductor fine particles greater in particle size scatter incident light to thereby contribute to improvement in a rate of light capturing, while semiconductor fine particles smaller in particle size increase dye adsorption sites to thereby contribute to improvement in an amount of adsorption of a dye.

In employing semiconductor fine particles in which fine particles different in particle size are employed, a ratio of an average grain size among fine particles is preferably one to ten or more. An average grain size of fine particles greater in particle size is, for example, not smaller than 100 nm and not greater than 500 nm. An average grain size of fine particles smaller in particle size is, for example, not smaller than 5 nm and not greater than 50 nm. In a case where semiconductor fine particles in which different semiconductor compounds are mixed are employed, reduction in particle size of a semiconductor compound higher in adsorption function is effective.

Though a thickness of the porous semiconductor layer is not particularly limited, for example, it is not smaller than 1 μm and not greater than 100 μm. The porous semiconductor layer preferably has a large surface area and the surface area is preferably, for example, not smaller than 10 $m^2/g$ and not greater than 200 $m^2/g$.

A method of forming a porous semiconductor layer is not particularly limited, and a known method can be employed. For example, the porous semiconductor layer may be formed by applying a suspension containing semiconductor fine particles described above onto first electrode 12 and collector electrode 17 and carrying out at least one of drying and firing.

Specifically, initially, a suspension is obtained by dispersing semiconductor fine particles in an appropriate solvent. Examples of such a solvent include a glyme-based solvent such as ethylene glycol monomethyl ether, alcohols such as isopropyl alcohol, an alcohol-based mixture solvent such as isopropyl alcohol/toluene, water, and the like. Instead of such a suspension, a commercially available titanium oxide paste (for example, Ti-nanoxide, T, D, T/SP, D/SP, manufactured by Solaronix) may be employed.

Then, the obtained suspension is applied onto first electrode 12 and collector electrode 17 and at least one of drying and firing is carried out to form the porous semiconductor layer. A known method such as a doctor blade method, a squeegee method, spin coating, and screen printing can be employed as a method of applying the suspension.

In a case where photoelectric conversion portion 13 and insulating frame portion 19 are formed to be in contact with each other, that is, a case where photoelectric conversion portion 13 is formed in the entire internal region surrounded by insulating frame portion 19, preferably, viscosity of the suspension is adjusted to be low and the suspension is applied to the region surrounded by insulating frame portion 19 by using a dispenser or the like. Since viscosity of the suspension is low in this case, the suspension spreads by self weight to an end portion of the region and leveling of an upper surface of photoelectric conversion portion 13 can readily be achieved.

Conditions such as a temperature, a time period, and an atmosphere for drying and firing of the suspension are set as appropriate, depending on a type of semiconductor fine particles. For example, drying and firing of the suspension can be carried out by holding in an atmosphere or in an inert gas atmosphere in a temperature range not lower than 50° C. and not higher than 800° C. for not shorter than 10 seconds and not longer than 12 hours. Drying and firing can be carried out once at a single temperature or two or more times with a temperature being varied.

The porous semiconductor layer may have a stack structure. In this case, suspensions containing different semiconductor fine particles are prepared, each of the suspensions is applied, and at least one of drying and firing is carried out.

After the porous semiconductor layer is formed, for the purpose of improvement in performance such as improvement in electrical connection among semiconductor fine particles, increase in surface area of the porous semiconductor layer, and lowering in defect level on the semiconductor fine particles, post-treatment may be performed. For example, in a case where a porous semiconductor layer is composed of titanium oxide, post-treatment with a titanium tetrachloride aqueous solution can improve performance of the porous semiconductor layer.

<Photosensitizer>

A photosensitizer to be carried on a porous semiconductor layer is exemplified by a sensitizing dye or a quantum dot. Examples of the sensitizing dye include various organic dyes, metal complex dyes, and the like having absorbability in visible light regions or infrared ray regions, and one or two or more types of these dyes can selectively be employed.

Examples of an organic dye include an azo-based dye, a quinone-based dye, a quinone-imine-based dye, a quinacridone-based dye, a squarylium-based dye, a cyanine-based dye, a merocyanine-based dye, a triphenylmethane-based dye, a xanthene-based dye, a porphyrin-based dye, a perylene-based dye, an indigo-based dye, a naphthalocyanine-based dye, and the like. An organic dye is generally higher in extinction coefficient than a metal complex dye in such a form that a molecule is coordinated to a transition metal.

A metal complex dye is a dye in which a metal is coordinated to a molecule. The molecule is exemplified by a porphyrin-based dye, a phthalocyanine-based dye, a naphthalocyanine-based dye, ruthenium-based dye, and the like. The metal is exemplified by Cu, Ni, Fe, Co, V, Sn, Si, Ti, Ge, Cr, Zn, Ru, Mg, Al, Pb, Mn, In, Mo, Y, Zr, Nb, Sb, La, W, Pt, TA, Ir, Pd, Os, Ga, Tb, Eu, Rb, Bi, Se, As, Sc, Ag, Cd, Hf, Re, Au, Ac, Tc, Te, Rh, and the like. Among these, as the metal complex dye, a metal complex dye in which a metal is coordinated to a phthalocyanine-based dye or a ruthenium-based dye is preferred, and a ruthenium-based metal complex dye is particularly preferred. A chemical formula of a preferred ruthenium-based metal complex dye is shown below.

For example, commercially available ruthenium-based metal complex dyes are exemplified by trade names Ruthenium 535 dye, Ruthenium 535-bis TBA dye, Ruthenium 620-1H3TBA dye, and the like manufactured by Solaronix.

In order to securely adsorb a dye to a porous semiconductor layer, a dye having in a dye molecule, an interlocking group such as a carboxyl group, an alkoxy group, a hydroxyl group, a sulfonic acid group, an ester group, a mercapto group, and a phosphonyl group is preferably employed. It is noted that an interlocking group generally provides electrical coupling facilitating electron transfer between a dye in an excited state and a conduction band of a semiconductor as it is interposed when a dye is fixed to a porous semiconductor layer.

A quantum dot which is a photosensitizer is exemplified by a cadmium compound, a lead compound, an indium compound, and the like. Specifically, CdS, CdSe, PbS, PbSe, InAs, and the like are exemplified.

A method of adsorbing the dye above to the porous semiconductor layer is exemplified by a method of immersing the porous semiconductor layer in a solution for dye adsorption in which a dye has been dissolved. In immersion, in order to permeate the solution for dye adsorption into a deep portion of small pores in the porous semiconductor layer, the solution for dye adsorption may be heated.

Any solvent capable of dissolving a dye therein is applicable as a solvent in which a dye is to be dissolved, and examples thereof include alcohol, toluene, acetonitrile, tetrahydrofuran (THF), chloroform, dimethylformamide, and the like. These solvents are preferably purified, and two or more types thereof may be mixed for use.

Concentration of a dye in the solution for dye adsorption can be set as appropriate depending on such a condition as a dye to be used, a type of a solvent, or a dye adsorption process. In order to improve an adsorption function, high concentration in the solution for dye adsorption is preferred, and for example, concentration not lower than $1 \times 10^{-5}$ mol/L is preferred. In preparing a solution for dye adsorption, a solution may be heated in order to improve solubility of a dye.

<Porous Insulating Layer 14>

Examples of a material for forming porous insulating layer 14 include niobium oxide, zirconium oxide, silicon oxide such as silica glass and soda glass, aluminum oxide, and barium titanate, and one or two or more of these materials can selectively be employed.

As a material for forming porous insulating layer 14, use of titanium oxides having a grain size not smaller than 100 nm and not greater than 500 nm or rutile-type titanium oxide thereamong is preferred. These materials are preferred because they are granular and an average grain size thereof is not smaller than 5 nm and not greater than 500 nm and preferably not smaller than 10 nm and not greater than 300 nm.

Porous insulating layer 14 can be formed with a method the same as that for photoelectric conversion portion 13 described above. Namely, an insulating material in a fine particle form is dispersed in a solvent and a polymeric compound such as ethyl cellulose or polyethylene glycol (PEG) is further mixed therein to thereby fabricate a paste. The paste is applied onto a surface of the porous semiconductor layer and at least one of drying and firing is carried out. Thus, porous insulating layer 14 is formed on the surface of the porous semiconductor layer.

<Catalyst Layer 15>

Catalyst layer 15 is formed on porous insulating layer 14. A method of forming catalyst layer 15 is not particularly limited and a known method can be employed. Specifically, in a case of employing platinum as a material for catalyst layer 15, such a method as sputtering, thermal decomposition of chloroplatinic acid, or electrodeposition can be employed for forming the catalyst layer on the surface of porous insulating layer 14.

Alternatively, in a case of employing carbon such as carbon black, ketjenblack, carbon nanotube, and fullerene as a material for catalyst layer 15, carbon dispersed in a solvent to be formed like a paste can be applied to porous insulating layer 14 with screen printing or the like to thereby form catalyst layer 15.

<Second Electrode 16>

Second electrode 16 may be formed of a material the same as that for first electrode 12 or may be formed of a material not having a light transmissive property. For example, second electrode 16 may be formed of such a metal material as titanium, tungsten, gold, silver, copper, aluminum, and nickel.

Second electrode 16 is formed with such a known method as sputtering and spraying. Second electrode 16 has a thickness preferably not smaller than 0.02 μm and not greater than 5 μm. Electrical resistance thereof is preferably as low as possible and it is preferably not higher than 40 Ω/sq.

<Sealing Portion>

As a material for a sealing portion, specifically, a silicone resin, an epoxy resin, a polyisobutylene-based resin, a hot melt resin, a glass-based material, and the like are preferred. The sealing portion may be composed of two or more of these materials and may have a stack structure. As a material for a sealing portion 19a, for example, model number: 31X-101 manufactured by ThreeBond Co., Ltd., model number: 31X-088 manufactured by ThreeBond Co., Ltd., a generally commercially available epoxy resin, and the like can be employed.

In a case of using a silicone resin, an epoxy resin, or glass frit, the sealing portion can be formed with a dispenser. In a case of using a hot melt resin, the sealing portion can be formed by making a patterned hole in a sheet-like hot melt resin.

<Cover 18>

As a material for cover 18, a material capable of sealing carrier transport material 13a and preventing introduction of water or the like from the outside is employed. In a case where cover 18 may serve as a light receiving surface of dye-sensitized solar cell 10, cover 18 is formed of a material having a light transmissive property similarly to light transmitting substrate 11. In the case of outdoor installation of dye-sensitized solar cell 10, a material having high mechanical strength such as tempered glass is preferably employed as a material for cover 18.

<Carrier Transport Material 13a>

A region surrounded by first electrode 12, second electrode 16, insulating frame portion 19, and the sealing portion is filled with carrier transport material 13a. Therefore, a space between cover 18 and second electrode 16 and pores in porous photoelectric conversion portion 13 and porous insulating layer 14 are filled with carrier transport material 13a.

Carrier transport material 13a is formed of a conductive material capable of transporting ions, and examples of a suitable material include a liquid electrolyte, a solid electrolyte, a gel electrolyte, a fused salt gel electrolyte, and the like.

A liquid electrolyte should only be a liquid substance containing redox species, and it is not particularly limited so long as it can generally be used in a battery, a solar cell, or the like. Specifically, a liquid electrolyte formed of redox specifies and a solvent capable of dissolving the same, a liquid electrolyte formed of redox species and fused salt capable of dissolving the same, and a liquid electrolyte formed of redox species, a solvent capable of dissolving the same, and fused salt are exemplified as a liquid electrolyte.

Examples of redox species include an $I^-/I^{3-}$ type, a $Br^{2-}/Br^{3-}$ type, an $Fe^{2+}/Fe^{3+}$ type, a quinone/hydroquinone type, and the like. Specifically, combination of iodine ($I_2$) and a metal iodide such as lithium iodide (LiI), sodium iodide (NaI), potassium iodide (KI), and calcium iodide ($CaI_2$) is preferred as redox species. In addition, combination of iodine and tetraalkyl ammonium salt such as tetraethyl ammonium iodide (TEAI), tetrapropyl ammonium iodide (TPAI), tetrabutyl ammonium iodide (TBAI), and tetrahexyl ammonium iodide (THAI) is preferred. Moreover, combination of bromine and a metal bromide such as lithium bromide (LiBr), sodium bromide (NaBr), potassium bromide (KBr), and calcium bromide ($CaBr_2$) is preferred. Among these, combination of LiI and $I_2$ is particularly preferred.

Examples of a solvent for redox species include a carbonate compound such as propylene carbonate, a nitrile compound such as acetonitrile, alcohols such as ethanol, water, an aprotic polar substance, and the like. Among these, a carbonate compound or a nitrile compound is particularly preferred. These solvents can also be employed as a mixture of two or more types.

A solid electrolyte is a conductive material capable of transporting electrons, holes, and ions, and it can be employed as an electrolyte for a solar cell and should have no fluidity. Specifically, examples of a solid electrolyte include a hole transport material such as polycarbazole, an electron transport material such as tetranitro fluorenone, a conductive polymer such as polypyrrole, a polymeric electrolyte obtained by solidifying a liquid electrolyte with a polymeric compound, a p-type semiconductor such as copper iodide and copper thiocyanate, an electrolyte obtained by solidifying a liquid electrolyte containing fused salt with fine particles, and the like.

A gel electrolyte is normally composed of an electrolyte and a gelling agent. Examples of a gelling agent include a cross-linked polyacrylic resin derivative, a cross-linked polyacrylonitrile derivative, a polyalkylene oxide derivative, silicone resins, a polymeric gelling agent such as a polymer having a nitrogen-containing heterocyclic quaternary compound salt structure in a side chain, and the like.

A fused salt gel electrolyte is normally composed of the gel electrolyte as above and ambient-temperature fused salt. Examples of ambient-temperature fused salt include nitrogen-containing heterocyclic quaternary ammonium salt compounds such as pyridinium salts and imidazolium salts, and the like.

An additive may be added as necessary to the electrolyte above. Examples of such an additive include a nitrogen-containing aromatic compound such as t-butyl pyridine (TBP), and imidazole salt such as dimethylpropyl imidazole iodide (DMPII), methylpropyl imidazole iodide (MPII), ethylmethyl imidazole iodide (EMII), ethyl imidazole iodide (EII), and hexylmethyl imidazole iodide (HMII).

Electrolyte concentration in the electrolyte is preferably in a range not lower than 0.001 mol/L and not higher than 1.5 mol/L and particularly preferably in a range not lower than 0.01 mol/L and not higher than 0.7 mol/L.

Dye-sensitized solar cell 10 is formed to satisfy relation of Isc×Rh<0.05×Voc, where Isc (A) represents a short-circuit current value of dye-sensitized solar cell 10, Rh (Ω) represents a total value of electrical resistance values of collector electrode 17, first electrode 12, and second electrode 16, and Voc (V) represents an open circuit voltage value of dye-sensitized solar cell 10.

According to the feature above, as can be seen also from experimental examples which will be described later, FF of dye-sensitized solar cell 10 can be approximately 0.7. Therefore, in the photoelectric conversion element having a light receiving surface greater in area, high FF and conversion efficiency can be maintained.

In a case where an inlet port for carrier transport material 13a is formed in a part of cover 18 and carrier transport material 13a is injected with a vacuum pressure injection method, a vacuum pressure impregnation method, or the like, absence of contact between cover 18 and second electrode 16 accelerates a rate of injection of carrier transport material 13a. Therefore, a time period for injection of carrier transport material 13a can be shortened.

In addition, since collector electrode 17 has corrosion resistance to carrier transport material 13a, stability and life of dye-sensitized solar cell 10 can be improved.

A photoelectric conversion module according to a second embodiment of the present invention will be described below.

(Second Embodiment)

Figure 3:
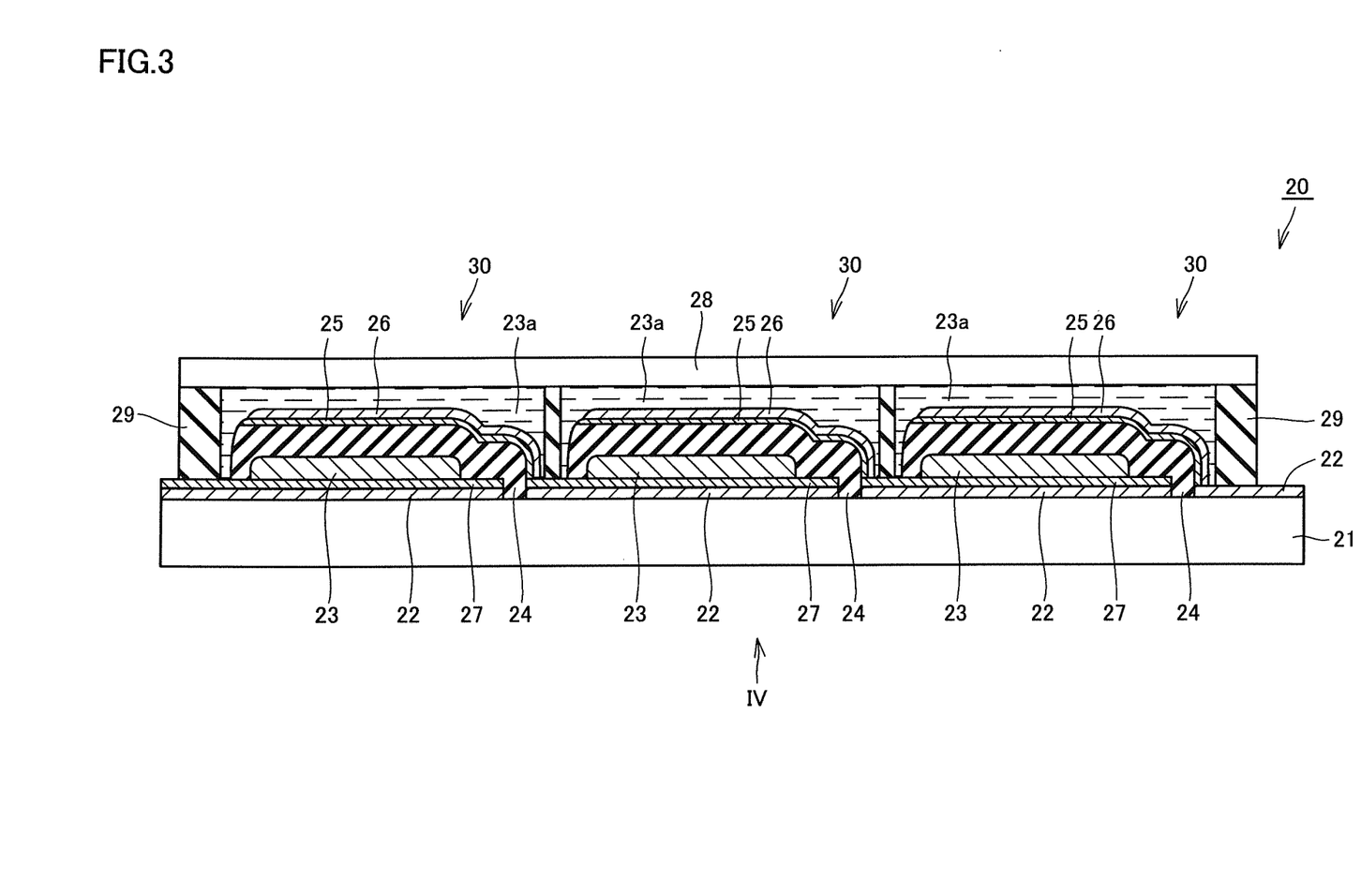
FIG. 3 is a cross-sectional view showing a structure of a photoelectric conversion module according to a second embodiment of the present invention.
Figure 4:
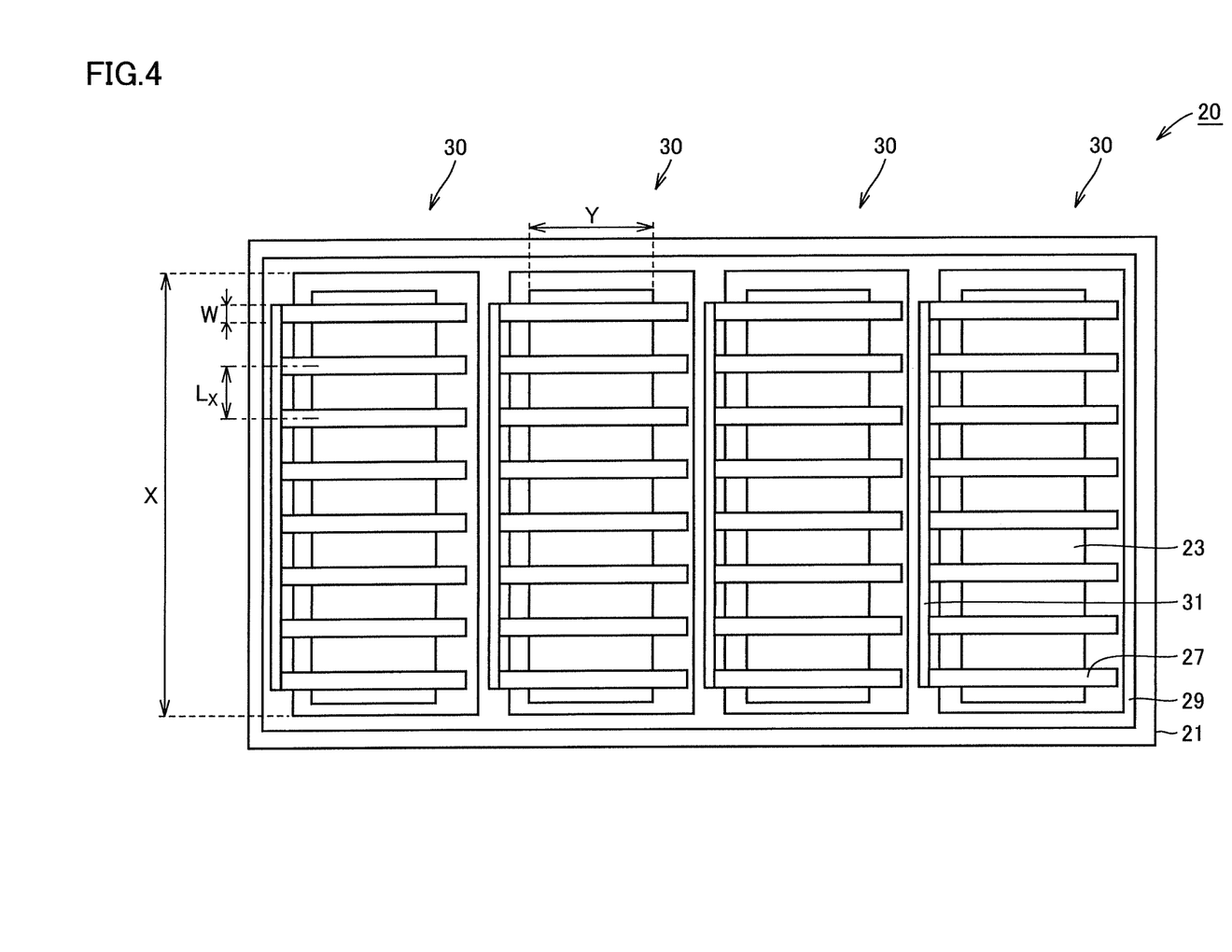
FIG. 4 is a diagram of the photoelectric conversion module in FIG. 3 viewed in a direction shown with an arrow IV.

FIG. 3 is a cross-sectional view showing a structure of a photoelectric conversion module according to the second embodiment of the present invention. FIG. 4 is a diagram of the photoelectric conversion module in FIG. 3 viewed in a direction shown with an arrow IV. It is noted that some features of the photoelectric conversion module are not illustrated in FIG. 3.

As shown in FIGS. 3 and 4, a photoelectric conversion module 20 according to the second embodiment of the present invention has a plurality of dye-sensitized solar cells 30 representing a plurality of photoelectric conversion elements. The plurality of dye-sensitized solar cells 30 are electrically connected in series.

Dye-sensitized solar cell 30 includes a light transmitting substrate 21 having at least a light receiving surface, a first electrode 22 formed from a transparent conductive film located on light transmitting substrate 21, and a collector electrode located on at least a part of first electrode 22 and formed from a metal thin film.

In addition, dye-sensitized solar cell 30 includes a photoelectric conversion portion 23 located on an upper surface of first electrode 22 or the collector electrode, carrying a photosensitizer, and immersed in a carrier transport material 23a and an insulating frame portion 29 surrounding sides of photoelectric conversion portion 23.

Moreover, dye-sensitized solar cell 30 includes a second electrode 26 located to be opposed to first electrode 22 above photoelectric conversion portion 23 and a cover 28. A small space is formed between cover 28 and second electrode 26, and the space is filled with carrier transport material 23a. It is noted that this space does not necessarily have to be formed.

Furthermore, dye-sensitized solar cell 30 includes a porous insulating layer 24 formed on photoelectric conversion portion 23 and a catalyst layer 25 formed on porous insulating layer 24, in the inside surrounded by insulating frame portion 29. Second electrode 26 is formed on catalyst layer 25.

In photoelectric conversion module 20, the plurality of dye-sensitized solar cells 30 are connected in series. In dye-sensitized solar cells 30 electrically connected to each other, first electrode 22 or the collector electrode of one dye-sensitized solar cell 30 is connected to second electrode 26 of the other dye-sensitized solar cell 30.

Insulating frame portion 29 electrically insulates from each other, first electrodes 22, the collector electrodes, and second electrodes 26 of dye-sensitized solar cells 30 adjacent to each other. In addition, insulating frame portion 29 and the sealing portion seal carrier transport material 23a such that it cannot move between dye-sensitized solar cells 30 adjacent to each other.

In the present embodiment, photoelectric conversion portion 23 has a rectangular shape having a longitudinal direction in a plan view. Specifically, photoelectric conversion portion 23 is formed with a length X and a width Y. Length X is not smaller than 10 mm. Width Y is not smaller than 5 mm and not greater than 10 mm. It is noted that a shape of photoelectric conversion portion 23 is not limited thereto and it may be circular or polygonal.

Dye-sensitized solar cells 30 connected in series are located such that the longitudinal directions of photoelectric conversion portions 23 are substantially in parallel to each other.

The collector electrode includes a parallel portion 27 extending in a direction orthogonal to the longitudinal direction of photoelectric conversion portion 23 and a coupling portion 31 connecting end portions of parallel portions 27 to one another. Parallel portion 27 of the collector electrode extends in a direction in which dye-sensitized solar cells 30 connected in series are aligned. Coupling portion 31 of the collector electrode extends in a direction orthogonal to the direction in which dye-sensitized solar cells 30 connected in series are aligned.

A plurality of parallel portions 27 of the collector electrodes, each having a width W, are formed. Parallel portions 27 of the collector electrodes adjacent to each other are formed at an interval of $L_x$. Width W is not smaller than 0.1 mm and not greater than 0.6 mm. Interval $L_x$ is not smaller than 5 mm and not greater than 10 mm.

Photoelectric conversion module 20 is formed to satisfy relation of $Isc \times Rh < 0.05 \times Voc$, where Isc (A) represents a short-circuit current value of dye-sensitized solar cell 30, Rh ($\Omega$) represents a total value of electrical resistance values of the collector electrode, first electrode 22, and second electrode 26, and Voc (V) represents an open circuit voltage value of dye-sensitized solar cell 30.

According to the feature above, as can be seen also from experimental examples which will be described later, FF of dye-sensitized solar cell 30 can be approximately 0.7. Therefore, in photoelectric conversion module 20 having a light receiving surface greater in area, high FF and conversion efficiency can be maintained.

In a case where an inlet port for carrier transport material 23a is formed in a part of cover 28 and carrier transport material 23a is injected with a vacuum pressure injection method, a vacuum pressure impregnation method, or the like, absence of contact between cover 28 and second electrode 26 accelerates a rate of injection of carrier transport material 23a. Therefore, a time period for injection of carrier transport material 23a can be shortened.

Description of features in photoelectric conversion module 20 the same as those in dye-sensitized solar cell 10 in the first embodiment will not be repeated.

Experimental results of experiments of conversion efficiency of a dye-sensitized solar cell depending on width W of a collector electrode and interval $L_x$ between the collector electrodes will be described below. It is noted that a thickness of each layer in experimental examples below was measured with trade name: SURFCOM 1400A manufactured by Tokyo Seimitsu Co., Ltd., unless otherwise specified.

(Experimental Example 1)

In order to fabricate photoelectric conversion module 20 having the structure shown in FIGS. 3 and 4, light transmitting substrate 21 having first electrode 22 formed was prepared. Specifically, a glass substrate with $SnO_2$ manufactured by Nippon Sheet Glass Co., Ltd. and having a size of 100 mm×200 mm was prepared.

<Formation of Collector Electrode>

An electron beam evaporation system EI-5 (manufactured by Ulvac Inc.) was employed to form a collector electrode on first electrode 22 to a thickness of approximately 1 μm at a vapor deposition rate of 0.1 Å/S. A metal, titanium, was employed as a material for the collector electrode.

Collector electrodes were formed, with widths W of parallel portions 27 of the collector electrodes being set to four conditions of 2 mm, 1 mm, 0.5 mm, and 0.2 mm, respectively. In addition, the collector electrodes were formed, with intervals $L_x$ between parallel portions 27 of the adjacent collector electrodes being set to eight conditions of 4 mm, 5 mm, 7.5 mm, 10 mm, 12.5 mm, 17.5 mm, 20 mm, and 30 mm, respectively.

<Formation of Insulating Frame Portion>

A screen printer (LS-34TVA manufactured by Newlong Seimitsu Kogyo Co., Ltd.) was used to apply glass fit (manufactured by Noritake Co., Limited.) onto light transmitting substrate 21, first electrode 22, or the collector electrode. After preliminarily drying at 100° C. for 10 minutes, firing at 450° C. was carried out for 1 hour. Formed insulating frame portion 29 had a thickness of approximately 25 μm.

<Formation of Porous Semiconductor Layer>

A screen printer (LS-34TVA manufactured by Newlong Seimitsu Kogyo Co., Ltd.) was used to apply a commercially available titanium oxide paste (manufactured by Solaronix, trade name Ti-Nanoxide D/SP, an average grain size of 13 nm) onto first electrode 22 or the collector electrode. After leveling at room temperature for 1 hour, the obtained coating film was preliminarily dried at 80° C. for 20 minutes, followed by firing at 450° C. for 1 hour. This process was repeated to fabricate a porous semiconductor layer having a thickness of 30 μm as the porous semiconductor layer.

<Adsorption of Sensitizing Dye>

Ruthenium 620-1H3TBA dye (manufactured by Solaronix) was employed as a sensitizing dye to prepare a 1:1 solution thereof with acetonitrile (manufactured by Aldrich Chemical Company)/t-butyl alcohol (manufactured by Aldrich Chemical Company) (concentration of the sensitizing dye; $4\times10^{-4}$ mol/liter). A porous semiconductor layer was immersed in this solution and left for 20 hours under a temperature condition of 40° C. Thereafter, the porous semiconductor layer was washed with ethanol (manufactured by Aldrich Chemical Company) and dried. Thus, the dye was adsorbed to the porous semiconductor layer.

<Formation of Porous Insulating Layer>

A paste containing fine particles of zirconium oxide having a grain size of 100 nm (manufactured by C. I. Kasei Co., Ltd.) was prepared with the method above. A screen printing plate used for fabrication of the porous semiconductor layer and a screen printer (LS-34TVA manufactured by Newlong Seimitsu Kogyo Co., Ltd.) were used to apply the prepared paste onto the porous semiconductor layer. After leveling at room temperature for 1 hour, preliminarily drying at 80° C. for 20 minutes was carried out, followed by firing at 450° C. for 1 hour. Porous insulating layer 24 having a thickness of 5 μm was formed in this step.

<Formation of Catalyst Layer>

An electron beam vapor deposition apparatus EVD-500A (manufactured by Anelva Corporation) was used to form catalyst layer 25 having a thickness of approximately 5 nm by vapor-depositing platinum on porous insulating layer 24 at a vapor deposition rate of 0.1 Å/s.

<Preparation of Electrolytic Solution>

For preparation of an oxidation-reduction electrolytic solution, acetonitrile was employed as a solvent, in which 0.6 mol/liter of DMPII (manufactured by Shikoku Chemicals Corporation), 0.1 mol/liter of LiI (manufactured by Aldrich Chemical Company), 0.5 mol/liter of TBP (manufactured by Aldrich Chemical Company), and 0.01 mol/liter of $I_2$ (manufactured by Tokyo Chemical Industry Co., Ltd.) were dissolved.

<Sealing with Cover>

An ultraviolet curable material 31X-101 (manufactured by ThreeBond Co., Ltd.) was applied onto insulating frame portion 29, and cover 28 formed from a glass substrate (Corning 7059) having a size of 50 mm×70 mm and light transmitting substrate 21 were bonded to each other. A portion to which an ultraviolet curable agent had been applied was irradiated with ultraviolet rays from an ultraviolet lamp Novacure (manufactured by EFD) to thereby fix light transmitting substrate 21 and cover 28.

<Injection of Electrolytic Solution>

Photoelectric conversion module 20 was fabricated by injecting an oxidation reduction electrolytic solution through an electrolytic solution inlet port provided in cover 28.

Figure 5:
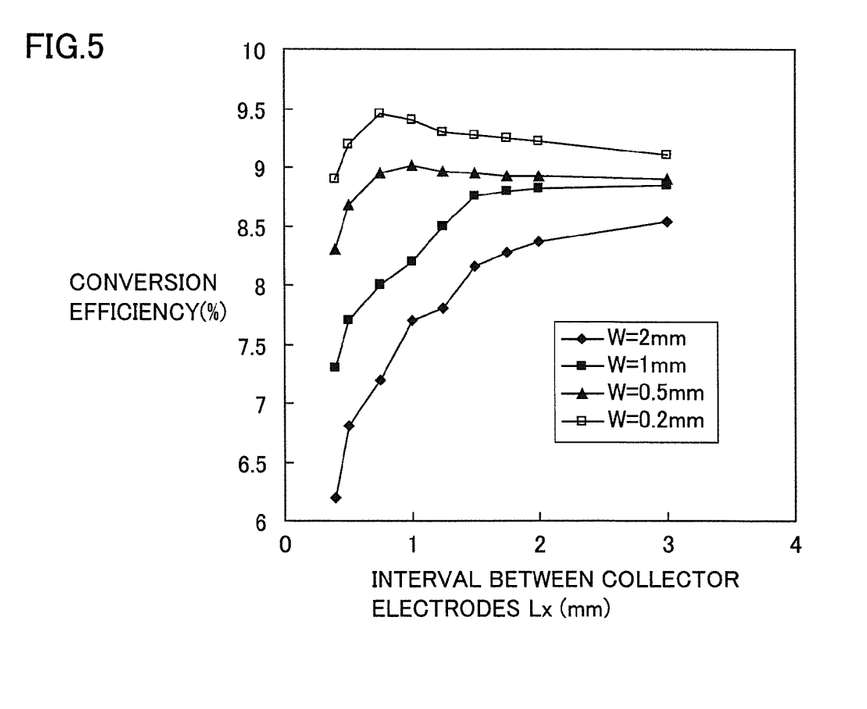
FIG. 5 is a graph showing relation between an interval $L_x$ between collector electrodes of the photoelectric conversion module and conversion efficiency (%) of the dye-sensitized solar cell.

FIG. 5 is a graph showing relation between interval $L_x$ between the collector electrodes of the photoelectric conversion module and conversion efficiency (%) of the dye-sensitized solar cell. FIG. 5 shows the ordinate representing conversion efficiency (%) and the abscissa representing interval $L_x$ (mm) between the collector electrodes.

Four types of photoelectric conversion modules 20 fabricated with the method above were irradiated with light at intensity of 1 kW/m$^2$ (AM 1.5 solar simulator) to determine conversion efficiency. It is noted that conversion efficiency was calculated by dividing short-circuit current value Isc by an area of an aperture area of the photoelectric conversion module (an area surrounded by connecting outer perimeters of several photoelectric conversion elements within the photoelectric conversion module) and multiplying the result of division by Voc and FF.

As shown in FIG. 5, as a value for interval $L_x$ between the collector electrodes is smaller, FF increases, however, an aperture ratio (a light receiving area ratio) decreases. A value for conversion efficiency is determined by trade-off thereof. When width W of the collector electrode is greater than 0.5 mm, an aperture ratio lowers with lowering in interval $L_x$ between the collector electrodes and conversion efficiency lowers with lowering in short-circuit current value Isc. When width W of the collector electrode is not greater than 0.5 mm, an aperture ratio lowers with lowering in interval $L_x$ between the collector electrodes, however, a degree of improvement in FF overcomes the lowering and conversion efficiency has an extreme value. It was when interval $L_x$ between the collector electrodes was not smaller than 5 mm and not greater than 10 mm that conversion efficiency exhibited a high value based on trade-off of the former.

Experimental results of experiments of relation between FF and Rh×Isc of the dye-sensitized solar cell will be described below.

(Experimental Example 2)

An electron beam evaporation system EI-5 (manufactured by Ulvac Inc.) was employed to form a collector electrode on first electrode 22 to a thickness of approximately 1 μm at a vapor deposition rate of 0.1 Å/S. A metal, titanium, was employed as a material for the collector electrode.

Collector electrodes were formed, with width W of parallel portion 27 of the collector electrode being set to 0.5 mm. In addition, the collector electrodes were formed, with intervals $L_x$ between the collector electrodes between parallel portions 27 of the adjacent collector electrodes being set to four conditions of 10 mm, 12.5 mm, 25 mm, and 50 mm, respectively. Other conditions and features were the same as those in experimental example 1.

Figure 6:
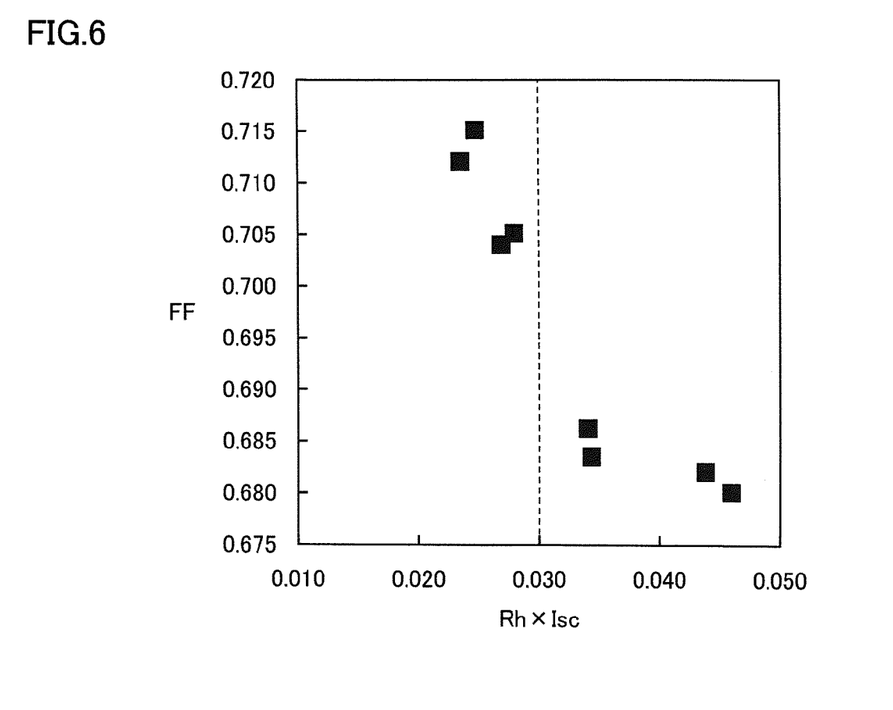
FIG. 6 is a graph showing relation between FF and Rh×Isc of the photoelectric conversion module.

FIG. 6 is a graph showing relation between FF and Rh×Isc of the photoelectric conversion module. FIG. 6 shows the ordinate representing FF and the abscissa representing Rh×Isc.

Four types of photoelectric conversion modules 20 fabricated with the method above were irradiated with light at intensity of 1 kW/m$^2$ (AM 1.5 solar simulator) to determine conversion efficiency. It is noted that conversion efficiency was calculated by dividing short-circuit current value Isc by an area of an aperture area of the photoelectric conversion module (an area surrounded by connecting outer perimeters of several photoelectric conversion elements within the photoelectric conversion module) and multiplying the result of division by Voc and FF. In addition, a resistance value at an intersection with an axis of Z"=0 on a high frequency side in the Cole-Cole plot obtained by impedance measurement was defined as Rh.

As shown in FIG. 6, it could be confirmed that FF significantly improved when a value for Rh×Isc was smaller than approximately 0.030 V (=0.05×Voc).

Therefore, by satisfying relation of Rh×Isc<0.05×Voc as in dye-sensitized solar cell 10, 30 in the present embodiment, FF not lower than 0.7 can be achieved. Thus, in photoelectric conversion element 20 having a light receiving surface greater in area, high FF and conversion efficiency can be maintained.

When relation of Rh×Isc<0.020 V (=0.03×Voc) is satisfied as shown in FIG. 6, FF is well over 0.7, however, width W of the collector electrode is great and interval $L_x$ between the collector electrodes is small. In this case, as shown in FIG. 5, an aperture ratio is low and conversion efficiency is low. Therefore, conditions for short-circuit current value Isc and Rh more preferably satisfy relation of 0.03×Voc<Rh×Isc<0.05×Voc.

Experimental results of experiments of relation between width Y of the photoelectric conversion portion and conversion efficiency (%) of the dye-sensitized solar cell will be described below.

(Experimental Example 3)

An electron beam evaporation system EI-5 (manufactured by Ulvac Inc.) was employed to form a collector electrode on first electrode 22 to a thickness of approximately 1 μm at a vapor deposition rate of 0.1 Å/S. A metal, titanium, was employed as a material for the collector electrode. Width W of parallel portion 27 of the collector electrode was set to 0.1 mm.

The porous semiconductor layer forming photoelectric conversion portion 23 was formed of titanium oxide. Width Y in the direction orthogonal to the longitudinal direction of photoelectric conversion portion 23 was set at 1-mm interval, from 3 mm to 15 mm. Interval $L_x$ between parallel portions 27 of adjacent collector electrodes was set to 8 mm. Other conditions and features were the same as those in experimental example 1.

Figure 7:
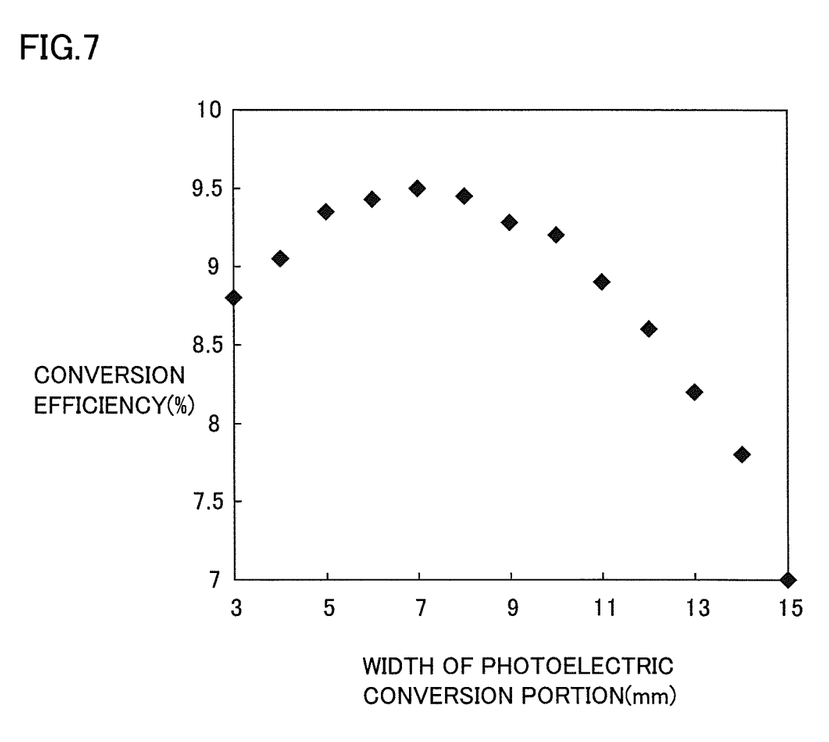
FIG. 7 is a graph showing relation between a width Y of a photoelectric conversion portion of the photoelectric conversion module and conversion efficiency (%) of the dye-sensitized solar cell.

FIG. 7 is a graph showing relation between width Y of the photoelectric conversion portion of the photoelectric conversion module and conversion efficiency (%) of the dye-sensitized solar cell. FIG. 7 shows the ordinate representing conversion efficiency (%) and the abscissa representing width Y (mm) of the photoelectric conversion portion.

When width Y of the photoelectric conversion portion is smaller, FF increases, however, a light receiving area ratio of the entire photoelectric conversion module lowers. Therefore, a value for conversion efficiency is determined by trade-off of the former. As shown in FIG. 7, it was when width Y of the photoelectric conversion portion was not smaller than 5 mm and not greater than 10 mm that conversion efficiency exhibited high value.

It is noted that the embodiments above disclosed herein are illustrative in every respect and do not form any ground for limitative interpretation. Therefore, the technical scope of the present invention is not to be construed only based on the embodiments described above but to be delimited based on the terms of the claims. In addition, any modifications within the scope and meaning equivalent to the terms of the claims are included.

Reference Signs List 10, 30 dye-sensitized solar cell; 11, 21 light transmitting substrate; 12, 22 first electrode; 13, 23 photoelectric conversion portion; 13a, 23a carrier transport material; 14, 24 porous insulating layer; 15, 25 catalyst layer; 16, 26 second electrode; 17 collector electrode; 18, 28 cover; 19, 29 insulating frame portion; 20 photoelectric conversion module; 27 parallel portion; and 31 coupling portion.

The invention claimed is:

1. A photoelectric conversion element, comprising:
a substrate having at least a light receiving surface;
a first electrode formed from a transparent conductive film located on said substrate;
a collector electrode located on at least a part of said first electrode and formed from a metal thin film;
a photoelectric conversion portion located on an upper surface of said first electrode or said collector electrode, carrying a photosensitizer, and immersed in a carrier transport material;
an insulating frame portion surrounding sides of said photoelectric conversion portion; and
a second electrode located to be opposed to said first electrode above said photoelectric conversion portion, relation of Isc×Rh<0.05 ×Voc being satisfied, where Isc (A) represents a short-circuit current value of said photoelectric conversion element, Rh (Ω) represents a total value of electrical resistance values of said collector electrode, said first electrode, and said second electrode, and Voc (V) represents an open circuit voltage value of said photoelectric conversion element;
the photoelectric conversion portion has a rectangular shape having a longitudinal direction in a plan view;
the photoelectric conversion portion has a width in a direction orthogonal to the longitudinal direction, not smaller than 5 mm and not greater than 10 mm; and
Isc and Rh satisfy the relation of 0.03×Voc<Rh×Isc<0.05×Voc.

2. A photoelectric conversion module, comprising a plurality of photoelectric conversion elements according to claim 1,
said plurality of photoelectric conversion elements being electrically connected in series, and
in said photoelectric conversion elements electrically connected to each other, said first electrode or said collector electrode of one said photoelectric conversion element being connected to said second electrode of the other said photoelectric conversion element.

3. The photoelectric conversion module according to claim 2, wherein
said collector electrode extends in a direction in which said photoelectric conversion elements connected in series are aligned.

4. The photoelectric conversion module according to claim 2, wherein
said photoelectric conversion portion has a rectangular shape having a longitudinal direction in a plan view, and
said photoelectric conversion elements connected in series are located such that said longitudinal directions of said photoelectric conversion portions are substantially in parallel to each other.

5. The photoelectric conversion module according to claim 4, wherein
said photoelectric conversion portion has a length in said longitudinal direction not smaller than 10 mm.

6. The photoelectric conversion module according to claim 4, wherein
said photoelectric conversion portion has a width in a direction orthogonal to said longitudinal direction, not smaller than 5 mm and not greater than 10 mm.

7. The photoelectric conversion module according to claim 3, wherein
said collector electrode has parallel portions extending substantially in parallel at an interval not smaller than 5 mm and not greater than 10 mm in a direction orthogonal to a direction of extension.

8. The photoelectric conversion module according to claim 7, wherein
aid parallel portion has a width not smaller than 0.1 mm and not greater than 0.6 mm.

9. The photoelectric conversion module according to claim 2, wherein
said collector electrode is formed of a material having corrosion resistance to said carrier transport material.

10. The photoelectric conversion module according to claim 9, wherein said collector electrode is formed of any of titanium, nickel, and tantalum.

* * * * *